US008681314B2

(12) United States Patent
Ebihara et al.

(10) Patent No.: US 8,681,314 B2
(45) Date of Patent: Mar. 25, 2014

(54) STAGE DEVICE AND COORDINATE CORRECTION METHOD FOR THE SAME, EXPOSURE APPARATUS, AND DEVICE MANUFACTURING METHOD

(75) Inventors: Akimitsu Ebihara, Fukaya (JP); Masato Takahashi, Saitama (JP)

(73) Assignee: Nikon Corporation, Tokyo (JP)

( * ) Notice: Subject to any disclaimer, the term of this patent is extended or adjusted under 35 U.S.C. 154(b) by 891 days.

(21) Appl. No.: 11/584,672

(22) Filed: Oct. 23, 2006

(65) Prior Publication Data

US 2007/0109522 A1 May 17, 2007

Related U.S. Application Data

(60) Provisional application No. 60/732,638, filed on Nov. 3, 2005.

(30) Foreign Application Priority Data

Oct. 24, 2005 (JP) ................................ 2005-308326

(51) Int. Cl.
*G03B 27/42* (2006.01)
*G03B 27/58* (2006.01)
*G03F 7/20* (2006.01)

(52) U.S. Cl.
CPC ........ *G03F 7/70783* (2013.01); *G03F 7/70875* (2013.01); *G03F 7/70725* (2013.01); *G03F 7/70775* (2013.01)
USPC ............................... 355/72; 355/53; 356/500

(58) Field of Classification Search
CPC ............ G03F 7/70783; G03F 7/70725; G03F 7/70775; G03F 7/70875
USPC ...................... 355/53, 72; 310/12.06; 356/500
See application file for complete search history.

(56) References Cited

U.S. PATENT DOCUMENTS

| 5,591,958 | A | * | 1/1997 | Nishi et al. .................... 250/205 |
| 5,637,973 | A | | 6/1997 | Hirai et al. |
| 5,825,043 | A | | 10/1998 | Suwa |
| 5,969,441 | A | | 10/1999 | Loopstra et al. |
| 5,991,005 | A | * | 11/1999 | Horikawa et al. ............... 355/53 |
| 6,208,407 | B1 | | 3/2001 | Loopstra |
| 6,259,174 | B1 | * | 7/2001 | Ono ............................... 310/13 |

(Continued)

FOREIGN PATENT DOCUMENTS

| EP | 0 598 924 A1 | 6/1994 |
| EP | 1 780 786 A1 | 5/2007 |

(Continued)

OTHER PUBLICATIONS

Dec. 5, 2006 International Search Report issued in Application No. PCT/JP2006/321142 (with translation).

(Continued)

*Primary Examiner* — Steven H Whitesell Gordon
(74) *Attorney, Agent, or Firm* — Oliff PLC

(57) ABSTRACT

A stage device includes a base, a movable table arranged above the base, a position information measurement device that measures position information of the movable table, a deformation amount detection unit that detects an amount regarding deformation of at least one of the base and the movable table, and a correction device that corrects the measured result of the position information measurement unit based on the detected result of the deformation amount detection unit.

26 Claims, 9 Drawing Sheets

(56) References Cited

U.S. PATENT DOCUMENTS

| | | | |
|---|---|---|---|
| 6,330,052 B1 * | 12/2001 | Yonekawa et al. | 355/53 |
| 6,341,007 B1 | 1/2002 | Nishi et al. | |
| 6,400,441 B1 | 6/2002 | Nishi et al. | |
| 6,549,269 B1 | 4/2003 | Nishi et al. | |
| 6,590,634 B1 | 7/2003 | Nishi et al. | |
| 6,611,316 B2 | 8/2003 | Sewell | |
| 6,721,034 B1 | 4/2004 | Horikawa | |
| 6,778,257 B2 | 8/2004 | Bleeker et al. | |
| 6,897,963 B1 | 5/2005 | Taniguchi et al. | |
| 7,119,884 B2 * | 10/2006 | Ottens et al. | 355/72 |
| 2007/0058146 A1 | 3/2007 | Yamaguchi | |

FOREIGN PATENT DOCUMENTS

| | | |
|---|---|---|
| JP | A 06-006993 | 1/1994 |
| JP | A H6-124873 | 5/1994 |
| JP | A 08-130179 | 5/1996 |
| JP | A 10-163099 | 6/1998 |
| JP | A 10-214783 | 8/1998 |
| JP | A 10-303114 | 11/1998 |
| JP | A 11-135400 | 5/1999 |
| JP | A 2000-505958 | 5/2000 |
| JP | A 2000-164504 | 6/2000 |
| JP | A 2000-240717 | 9/2000 |
| JP | A 2000-269118 | 9/2000 |
| JP | A 2001-510577 | 7/2001 |
| JP | A-2002-118050 | 4/2002 |
| JP | A 2003-209044 | 7/2003 |
| JP | A 2003-262501 | 9/2003 |
| JP | A 2004-165497 | 6/2004 |
| JP | A 2004-519850 | 7/2004 |
| JP | A 2005-252246 | 9/2005 |
| WO | WO 99/23692 | 5/1999 |
| WO | WO 99/28790 | 6/1999 |
| WO | WO 99/49504 | 9/1999 |
| WO | WO 01/35168 A1 | 5/2001 |
| WO | WO 02/069049 A2 | 9/2002 |
| WO | WO 2005/122242 A1 | 12/2005 |

OTHER PUBLICATIONS

Dec. 5, 2006 Written Opinion issued in Application No. PCT/JP2006/321142(with translation).

Japanese Patent Office, Notice of Reasons for Rejection mailed Mar. 13, 2012 in Japanese Patent Application No. 2007-542585 w/English-language Translation.

Dec. 20, 2011 Office Action issued in Japanese Patent Application No. 2007-542585 (with translation).

Mar. 26, 2013 Office Action issued in Taiwanese Patent Application No. 095139124 (with translation).

* cited by examiner

STAGE DEVICE AND COORDINATE CORRECTION METHOD FOR THE SAME, EXPOSURE APPARATUS, AND DEVICE MANUFACTURING METHOD

CROSS-REFERENCE TO RELATED APPLICATION

This application is non-provisional application claiming benefit of provisional application No. 60/732,638, filed Nov. 3, 2005, and claims priority to Japanese Patent Application No. 2005-308326, filed on Oct. 24, 2005, the contents of which are incorporated herein by reference.

BACKGROUND OF THE INVENTION

1. Field of the Invention

The present invention relates to a stage device and an exposure apparatus having the stage device. The present invention also relates to a coordinate correction method for a stage device, and a device manufacturing method 2. Description of the Related Art In a lithography process as one of manufacturing processes of a micro device (electric device or the like), an exposure apparatus is used to expose and transfer a pattern formed on a mask (reticle, a photo mask and the like) onto a substrate applied with a photoresist (or, a wafer, ceramic plate, glass plate and the like). For the exposure apparatus, for example, a full field exposure type such as a stepper type and the like or a scanning exposure type such as a step-and-scan system and the like are used.

The exposure apparatus has a stage device, and a table portion of the stage device has a reflecting surface (mirror surface). The reflecting surface is used for an optical measurement device such as a laser interferometer to perform measurement of position with high accuracy. The position of the table portion is measured and controlled in nanometers. In accordance with requirement of higher accuracy, the geometry (contour) of the reflection surface and deformation of a base occurred by the heat are caused as problems. Further, heat is accumulated on the table portion by repetition of exposure, may cause thermal deformation of the table portion and the reflection surface. Japanese Patent Laid-Open No. 2005-252246 discloses technology that measuring tee geometry of the reflection surface for each lot (e.g., several tens of substrates), and coordinate correction is carried out for correct the table portion and the reflecting surface that have suffered thermal deformation.

The coordinate correction like above requires a little bit of time (for example, it takes 20 to 30 minutes). By this, handling of the exposure is stopped substantially.

SUMMARY OF THE INVENTION

An object of the present invention is to provide a stage device being position controlled in high accuracy and a coordinate correction method for it.

According to a first aspect of the present invention, a stage device is provided, which comprises a base; a movable table arranged on the base; a position information measurement device that measures position information of the movable table; a deformation amount detection device that detects an amount regarding deformation of at least one of the base or the movable table; and a correction device that corrects a measured result of the position information measurement device based on a detected result of the deformation amount detection device.

According to a second aspect of the present invention, an exposure apparatus that transfers a pattern onto a substrate is provided, which comprises the stage device as mentioned above is used to drive the substrate. The exposure apparatus can move the substrate accuracy.

According to a third aspect of the present invention, a coordinate correction method is provided, which comprises the steps of, measuring position information of a movable table on a base by utilizing a position information measurement device; detecting an amount regarding deformation of at least one of the base and the movable table by a deformation amount detection device provided on at least one of the base and the movable table; calculating strain data from the detected amount regarding the deformation by a calculating device; and correcting the position information measured by the position information measurement device based on the strain data by a correction device.

According to a fourth aspect of the present invention, a device manufacturing method is provided, which uses the exposure apparatus as recited in above. Accordingly, it is possible to manufacture a device more precisely with the device manufacturing method of the present invention.

Based on the present invention, it is possible to provide a stage device being position controlled in high accuracy and a coordinate correction method for it.

DESCRIPTION OF THE PREFERRED EMBODIMENTS

Hereinafter, a preferred embodiment of the present invention will be described with reference to figures. In the present embodiment, the present invention is applied to a projection exposure apparatus of a full field exposure type, such as a stepper and the like, or a projection exposure apparatus of a scanning exposure type, such as a scanning stepper and the like.

Figure 1:
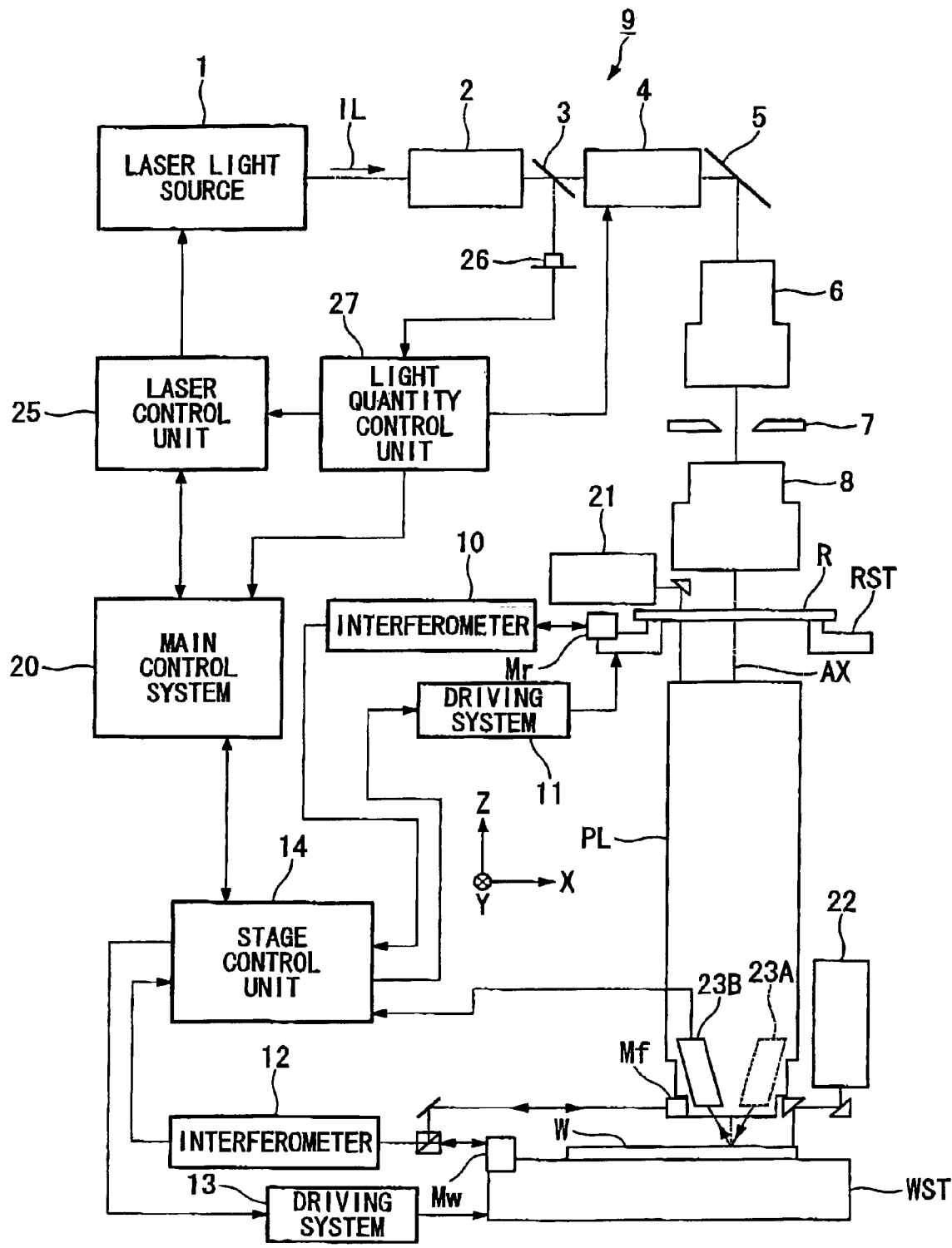
FIG. 1 shows a schematic configuration of a projection exposure apparatus of an embodiment of the present invention.

FIG. 1 is a block diagram of functional units constituting a projection exposure apparatus. In FIG. 1, a chamber housing the projection exposure apparatus therein is not shown. Referring to FIG. 1, a laser light source 1 composed of KrF excimer laser (wavelength: 248 nm) or ArF excimer laser (wavelength: 193 nm) is used as a light source for exposure. As the exposure light source, one that irradiates laser light of an ultraviolet range at an oscillation stage, such as an F2 laser (wavelength: 157 nm), one that irradiates harmonic laser light of a vacuum ultraviolet range, which is obtained through wavelength conversion of laser light of a near-infrared range from a solid-state laser source (YAG or semiconductor laser or the like), a mercury discharge lamp, which is often used for the exposure apparatus of this type, and others may also be used. In other word, the bright lines (g, h, and i lines) emitted from, for example, a mercury lamp, deep ultraviolet light (DUV light) such as KrF excimer laser light (248 nm wavelength), and vacuum ultraviolet light (VUV light), such as ArF excimer laser light (193 nm wavelength) and $F_2$ laser light (157 nm wavelength) will be used as the exposure light.

Illumination light IL from the laser light source 1 illuminates a reticle blind 7 with uniform illuminance distribution via an illuminance-uniformalizing optical system 2 configured with a lens system and a fly-eye lens system, a beam splitter 3, a variable beam attenuator 4 for adjustment of quantity of light, a mirror 5, and a relay lens system 6. The illumination light IL restricted to a prescribed shape (for example, rectangle in the case of the full field exposure type, slit shape in the case of the scanning exposure type) by the reticle blind 7 is illuminated onto the reticle R as a mask via an imaging lens system 8, whereby an image of the opening of the reticle blind 7 is formed on the reticle R. An illumination optical system 9 is configured by including the illuminance-uniformalizing optical system 2, the beam splitter 3, the variable beam attenuator 4 for adjustment of quantity of light, the mirror 5, the relay lens system 6, the reticle blind 7, and the imaging lens system 8.

Of the circuit pattern region (pattern) formed on the reticle R, the image of the portion illuminated by the illumination light is projected and formed on a wafer W applied with a photoresist as a substrate (sensitive substrate or photoconductor) via a projection optical system PL that is telecentric on both sides and has a projection magnification β of reduction magnification. While the projection optical system PL is of a dioptric system (a fraction system), alternatively, a catadioptric type system or the like may also be used. The present invention is applicable, not only to the wafer W, but also to a glass substrate for a liquid crystal, a ceramic substrate for a magnetic head and others. In the following, description will be made with a Z axis taken in parallel with an optical axis AX of the projection optical system PL, an X axis taken in a direction parallel to the paper plane of FIG. 1 within a plane perpendicular to the Z axis, and a Y axis taken in a direction perpendicular to the paper plane of FIG. 1. In the case where the projection exposure apparatus of the present embodiment is of a scanning exposure type, the direction along the Y axis (Y direction) corresponds to the scanning direction of the reticle R and the wafer W during scanning exposure, and the illumination area on the reticle R is elongated in the direction along the x axis (direction) that is a non-scanning direction.

The reticle R arranged on an object surface side of the projection optical system PL is held on a reticle stage RST (mask stage) by vacuum suction and the like. The moving coordinate location of the reticle stage RST (position in the X direction, position in the Y direction, and rotation angle around the Z axis) is sequentially measured by using a movable mirror Mr for reticle, which is set to the reticle stage RST, a reference mirror (not shown), which is secured to an upper side surface of the projection optical system PL, and a laser interferometer system 10 for reticle, which is arranged to face them. The laser interferometer system 10 for reticle in effect constitutes at least three axis laser interferometers with at least one axis in the X direction and at least two axes in the Y direction.

Further, the reticle stage RST is moved by a driving system 11 for reticle, which is configured with a linear motor, a fine-motion actuator, and the like. The measurement information of the laser interferometer system 10 for reticle is supplied to a stage control unit 14, and the stage control unit 14 controls the operation of the driving system 11 for reticle based on the relevant measurement information as well as control information (input information) from a main control system 20 composed of a computer that performs overall control of the operation of the entire apparatus.

Meanwhile, the wafer W arranged on an image plane side of the projection optical system PL is held on a wafer stage WST (movable stage) by vacuum suction and the like. The wafer stage WST includes a wafer table WTB (described later in detail) holding the wafer W by suction, and a Z leveling mechanism (described later in detail) for controlling a focus position of the wafer W (position in the Z direction) and tilt angles around the X axis and the Y axis.

In the case of the full field exposure type, the wafer stage WST moves on a guide surface in a stepwise manner in the X direction and the Y direction. In the case of the scanning exposure type, the wafer stage WST is rested on the guide surface such that it can move at constant velocity at least in the Y direction during scanning exposure and also move in a stepwise manner in the X direction and the Y direction. The moving coordinate location of the wafer stage WST position in the X direction, position in the Y direction, and rotation angle around the Z axis) is sequentially measured by using a reference mirror Mf, which is secured at the bottom of the projection optical system PL, a movable mirror Mw, which is secured to the wafer stage WST, and a laser interferometer system 12, which is arranged to face them. The movable mirror Mw, the reference mirror Mf, and the laser interferometer system 12 in effect constitute at least three axis laser interferometers with at least two axes in the X direction and at least one axis in the Y direction. The laser interferometer system 12 in effect also includes two axis laser interferometers for measurement of rotation angles (yawing, pitching) around the X axis and the Y axis.

Referring to FIG. 1, the wafer stage WST is moved by a driving system 13 that is composed of a linear motor and an actuator such as a voice coil motor (VCM) or the like, The measurement information of the laser interferometer system 12 is supplied to the stage control unit 14, and the stage control unit 14 controls the operation of the driving system 13 based on the relevant measurement information and control information (input information) from the main control system 20.

Oblique incidence type multipoint auto-focus sensor 23A, 23B is secured at the lower side surface of the projection optical system PL. The stage control unit 14 uses information of an amount of lateral displacement of the slit image to calculate an amount of defocus from the image plane of the projection optical system PL at each of a plurality of measuring points, and during the exposure, it drives the Z leveling mechanism in the wafer stage WST by autofocusing such that the defocus amount falls within a prescribed control accuracy.

The stage control unit 14 further includes a control circuit on the reticle side, which optimally controls the driving system 11 for reticle based on the measurement information of the laser interferometer system 10 for reticle, and a control circuit on the wafer side, which optimally controls the driving system 13 for wafer based on the measurement information of the laser interferometer system 12. In the case where the projection exposure apparatus of the present embodiment is of the scanning exposure type, upon synchronous scanning of the reticle R and the wafer W during the scanning exposure, the control circuits control the respective driving systems 11 and 13 in a cooperative manner. The main control system 20 carries out optimal exposure processing in accordance with a program designated by an operator, by transmitting commands and parameters to and from the respective control circuits in the stage control unit 14. To this end, an unillustrated control panel unit (including an input device and a display device) is provided, which forms an interface between the operator and the main control system 20.

Further, it is necessary to perform alignment of the reticle R with the wafer W prior to exposure. To this end, the projection exposure apparatus in FIG. 1 is provided with a reticle alignment system (RA system) 21 for setting the reticle R at a prescribed position, and an off-axis type alignment system 22 for detecting a mark on the wafer W.

Referring to FIG. 1, in the case of the full field exposure type, an operation of projecting a pattern of the reticle R via the projection optical system PL onto one shot area on the wafer W with the illumination light IL, and an operation of moving the wafer W via the wafer stage WST in a stepwise manner in the X direction and the Y direction, are repeated in a step-and-repeat manner. On the other hand, in the case of the scanning exposure type, a scanning exposure operation is carried out, wherein after initiation of illumination of the reticle R with the illumination light IL, in the state where an image of a part of the pattern of the reticle R via the projection optical system PL is projected on one shot area on the wafer W, the reticle stage RST and the wafer stage WST are moved synchronously (synchronous scanning) in the Y direction, by using the projection magnification $\beta$ of the projection optical system PL as a velocity ratio, so that the pattern image of the reticle R is transferred to the shot area. Thereafter, an operation of moving the wafer W via the wafer stage WST in a stepwise manner in the X direction and the Y direction after stopping illumination with the illumination light IL, and the scanning exposure operation as described above are repeated, so that the pattern image of the reticle R is transferred to all the shot areas on the wafer W by a step-and-scan method.

Hereinafter, a configuration of a wafer stage system of the projection exposure apparatus of the present embodiment, including a wafer stage WST and a driving mechanism for the same, and an operation of the wafer stage system will be described in detail.

Figure 2:
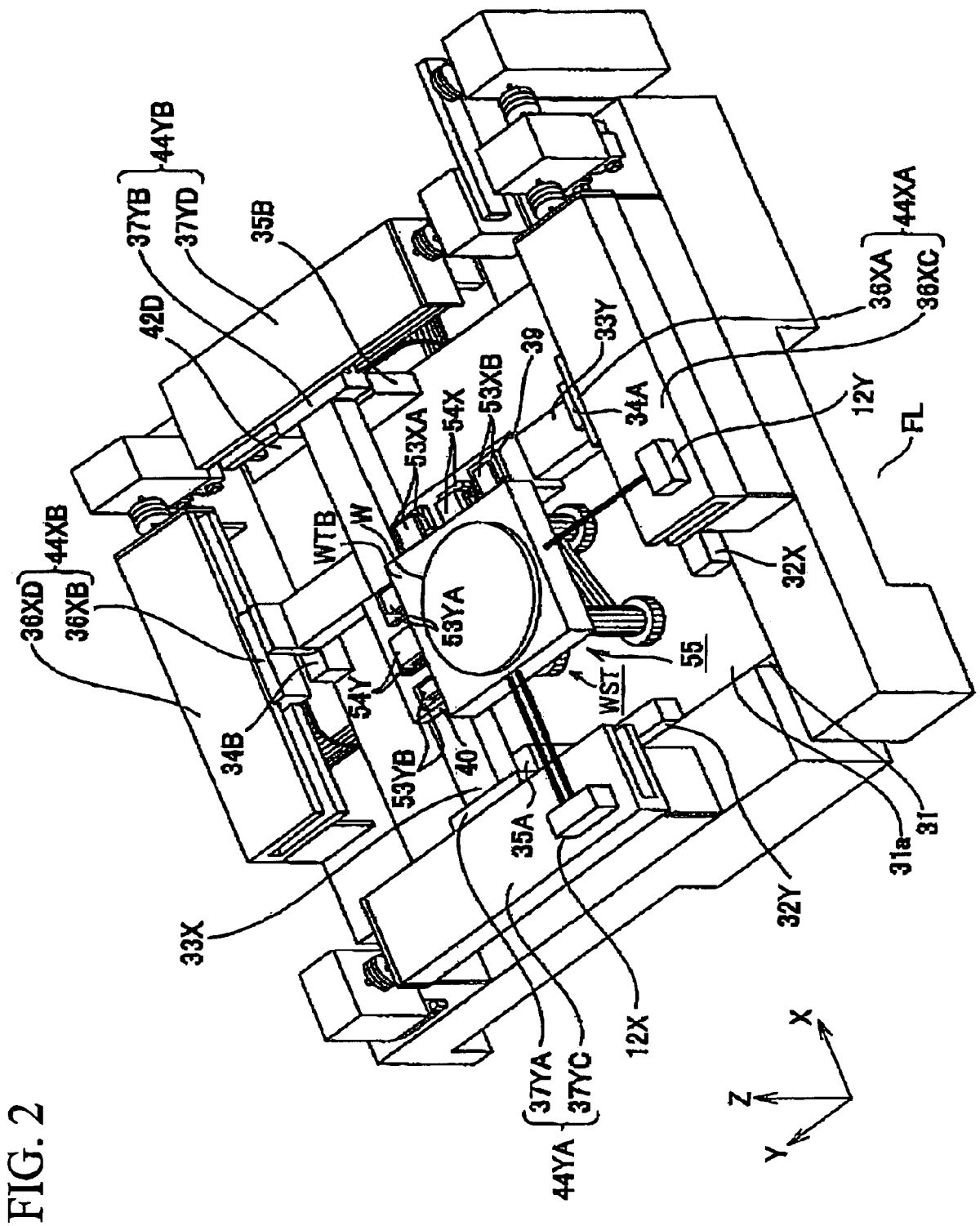
FIG. 2 is a perspective view showing a wafer stage system of the projection exposure apparatus of the present invention.

FIG. 2 shows the wafer stage system of the projection exposure apparatus of the present embodiment. Referring to FIG. 2, a base 31 (base member) of a flat plate shape is settled on a floor FL (setting surface), with a vibration isolation device (not shown) interposed therebetween, in a clean room of a semiconductor device manufacturing plant for example. An upper surface of the base 31 for wafer constitutes a guide surface 31*a* that is finished with high flatness. The guide surface 31*a* is perpendicular to the z axis, and is approximately parallel to the horizontal plane.

The wafer stage WST is rested on the guide surface 31*a* via an air bearing so as to be movable in the X and Y directions. The wafer stage WST is provided with a wafer table WTB that holds a wafer W (object) by suction, and a Z leveling mechanism 55 that controls the position in the Z direction of the wafer table WTB and the tilt angles (yawing, pitching) around the X and Y axes. Further, above the guide surface 31*a*, a Y axis guide 33Y approximately parallel to the Y axis is arranged so as to be movable in the X direction, and above the Y axis guide 33Y, an X axis guide 33X approximately parallel to the X axis is arranged so as to be movable in the Y direction. The Y axis guide 33Y and the X axis guide 33X are substantially orthogonal to each other. On the outer surface of the Y axis guide 33Y, a cylindrical Y axis slider 39 is mounted in a manner movable in the Y direction, and on the outer surface of the X axis guide 33X, a cylindrical X axis slider 40 is mounted in a manner movable in the X direction. The inner surfaces of the sliders 39 and 40 are in contact with the outer surfaces of the guides 33Y and 33X, respectively, via air bearings (thin gas layers of air or the like), which ensures smooth movement of the sliders 39 and 40 along the guides 33Y and 33X, respectively. The Z leveling mechanism 55 is connected to the sliders 39 and 40, and the wafer table WTB is rested on the Z leveling mechanism 55 in a state allowing control of relative positional relations with the sliders 39 and 40.

Magnets are arranged on the inner surfaces of stators 37YC and 37YD in the Y direction at prescribed pitches. Movers 36XA and 36XB and stators 36XC and 36XD constitute a pair of X axis linear motors 44XA and 44XB as a coarse-motion mechanism for driving the Y axis guide 33Y in the X direction with respect to the guide surface 31*a*. Further, movers 37YA and 37YB and stators 37YC and 37YD constitute a pair of Y axis linear motors 44YA and 44YR as a coarse-motion mechanism for driving the X axis guide 33X in the Y direction with respect to the guide surface 31*a*.

Referring to FIG. 2, the Z leveling mechanism 55 is connected to the sliders 39 and 40, and the wafer table WTB is rested on the Z leveling mechanism 55 via the air bearing. The wafer table WTB and the Y axis slider 39 are connected in a non-contact manner, in a state allowing control of their relative positions, via X axis actuators 53XA, 53XB, each made of a voice coil motor, and an X axis actuator 54X of an EI core system. The wafer table WTB and the X axis slider 40 are connected in a non-contact manner, in a state allowing control of their relative positions, via Y axis actuators 53YA, 53YB, each made of a voice coil motor, and a Y axis actuator 54Y of an EI core system.

It is noted that the actuators 53XA, 53XB, 53YA and 53YB made of the voice coil motors and the actuators 54X and 54Y of the EI core system described above each have a coil portion receiving power supply that is arranged on the side of the X axis slider 40 or the Y axis slider 39 (so-called moving magnet method). This eliminates the need to connect to the wafer table WTB wiring for supplying power (power wire and the like) or piping for coolant necessary when cooling the coils.

In this case, the actuators 54X and 54Y control average positions of the wafer table WTB in the X and Y directions with respect to the sliders 39 and 40. Fine adjustment of the position of the wafer table WTB in the X direction and fine adjustment of the rotation angle around the Z axis are carried out by using an average value and balance of thrust of the actuators 53XA and 53XB in the X direction, and fine adjustment of the position of the wafer table WTB in the Y direction is carried out by using an average value of thrust of the actuators 53YA and 53YB in the Y direction. That is, it can be considered that the actuators 53XA, 54X, 53XB, 53YA, 54Y and 53YB constitute a fine-motion mechanism that relatively moves the wafer table WTB (wafer W) with respect to the sliders 39 and 40 within a prescribed narrow range in the X direction, in the Y direction, and in the rotation direction around the Z axis.

Further, referring to FIG. 2, the minor-finished side surface of the wafer table WTB in the −X direction is irradiated with two laser beams spaced apart from each other in the Y direction from the laser interferometer 12X, and the mirror-finished side surface of the wafer table WTB in the −Y direction is irradiated with a laser beam from the laser interferometer 12Y, and the coordinates of the wafer table WTB in the X direction and the Y direction and the rotation angle around the Z axis are measured by the laser interferometers 12X and 12Y. The laser interferometers 12X and 12Y correspond to the laser interferometer system 12 in FIG. 1. The linear motors 44XA, 44XB, 44YA and 44YB (coarse-motion mechanism) and the actuators 53XA, 54X, 53XB, 53YA, 54Y and 53YB (fine-motion mechanism) correspond to the driving system 13 in FIG. 1.

The stage control unit 14 in FIG. 1 drives the coarse-motion mechanism and the fine-motion mechanism based on the measurement information of the laser interferometers 12X and 12Y and others. The former coarse-motion mechanism can be used for stepwise movement of the wafer table WTB in the full field exposure type and the scanning exposure type, and it can further be used for constant velocity movement of the wafer table WTB during synchronous scanning in the scanning exposure type. The latter fine-motion mechanism can be used for correcting a positioning error of the wafer table WTB in the full field exposure type and the scanning exposure type, and it can further be used for correcting a synchronization error of the wafer table WTB during scanning exposure in the scanning exposure type.

Figure 3:
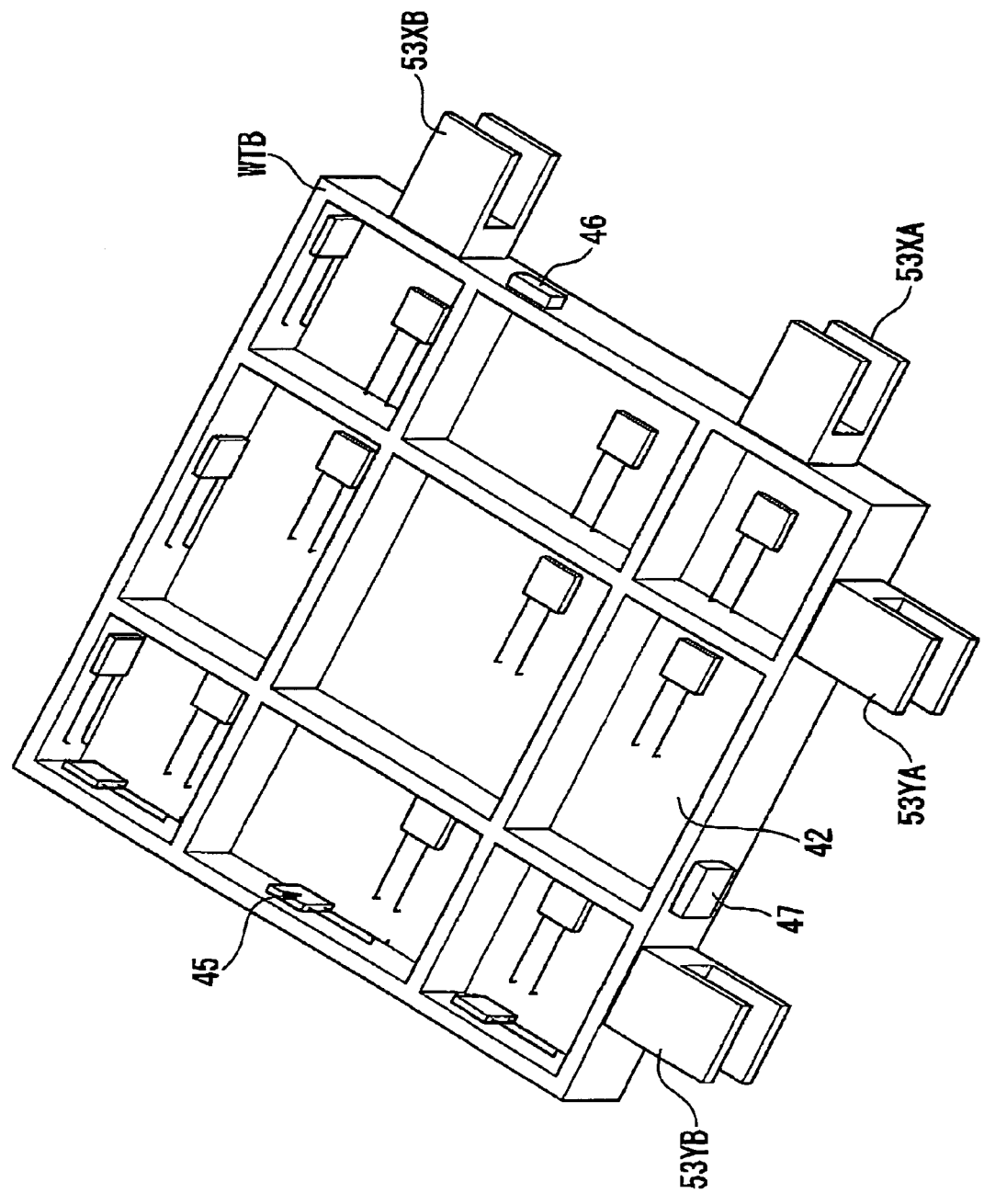
FIG. 3 shows a back surface of a wafer table to which strainmeters are attached.

FIG. 3 shows a back surface of the wafer table WTB. In FIG. 3, for ease of understanding of the following explanation, the actuator 54Y, the actuator 54Y, and the surface in contact with the air bearing of the Z leveling mechanism 55, explained in conjunction with FIG. 2, are not shown. The wafer table WTB (table portion) is made of a material of high specific rigidity (value of rigidity divided by a weight exerted on a unit volume), which is resistant to deformation and is light-weight. For example, the material of the wafer table WTB may be ceramics. For the ceramics, one having a low expansion coefficient, specifically glass ceramic, is preferable, because occurrence of its thermal expansion during the exposure will vary the value measured by the laser interferometer system 12.

Further, as seen from FIG. 3, the wafer table WTB (table portion) has its wall surface made as thin as possible to reduce weight, and is reinforced with a plurality of ribs extending in the X and Y directions. In FIG. 3, the ribs extending in the X and Y directions form nine block rooms 42. In each block room 42, a deformation amount detection sensor is attached, which detects minute expansion/contraction that occurs on the wafer table WTB. Specifically, a strainmeter 45 (strain gauge) is attached, which can detect the expansion/contraction in picometers by using a change in electric resistance. In each block room 42, three uniaxial type strainmeter 45 are attached to detect the strain amounts Sm in the X, Y and Z directions. It is of course possible to change the number of strainmeters 45 to be attached in accordance with the types of the strainmeters, which include a cross type that can measure in two axis directions perpendicular to one strainmeter, a Rosette type (Rosette gauge) that can measure in two axis directions perpendicular to the strainmeter as well as an intermediate axis direction thereof. It is desirable to attach a largest possible number of strainmeters 45 in the X and Y directions in order to allow detailed detection of the minute expansion/contraction that would occur on the wafer table WTB.

Although the wafer table WTB is made of the material such as glass ceramic or the like of which thermal expansion is small as described above, nevertheless, the wafer table WTB slightly expands during the exposure. The strainmeter 45 detects such slight thermal expansion.

A power receiving unit 46 and a signal transmitting/receiving unit 47 are provided on the side wall of the wafer table WTB. The power receiving unit 46 is configured with an electromagnetic induction coil, for which specifically an E type core or a pot core can be used. With this configuration, the power receiving unit 46 receives power from a power supplying unit 48 on the fixed side (see FIG. 4) in a non-contact manner. The signal transmitting/receiving unit 47 is configured with a photo coupler using infrared radiation or the like, or a radio wave transceiver using weak radio waves. The signal transmitting/receiving unit 47 communicates with a signal transmitting/receiving unit 49 on the fixed side (see FIG. 4). The signal transmitting/receiving unit, whether it is a photo coupler using infrared radiation or the like, or a radio wave transceiver using weak radio waves, can transmit/receive signals by superimposing them, by using two or more kinds of frequencies, or by providing frequency modulation. A transmitting device according to the present invention is configured to include, for example, the power receiving unit 46, the signal transmitting/receiving unit 47, the power supplying unit 48, and the signal transmitting/receiving unit 49 on the fixed side.

As described in conjunction with FIG. 2, the position of the wafer table WTB can be controlled in a non-contact manner, which can reduce an influence of vibration due to disturbance and the like. While the contact of a power wire or a communication line between the wafer table WTB and its outer portion has been avoided because of preference of the non-contact state of the wafer table WTB, the above-described configuration of the power receiving unit 46 and the signal transmitting/receiving unit 47 enables power supply and signal supply in a non-contact manner.

Figure 4:
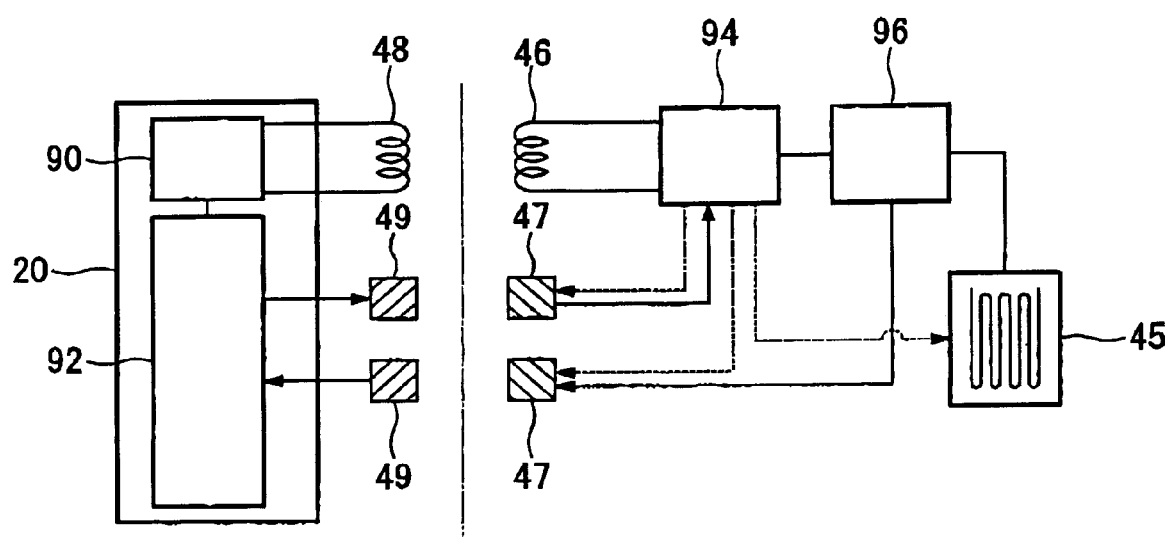
FIG. 4 is a block diagram of an electrical system provided at the wafer table.

FIG. 4 is a block diagram of an electrical system provided at the wafer table WTB, which consists of the main control system 20 (and the stage control unit 14; hereinafter explained as the main control system 20) on a fixed side corresponding to a fixedly installed side, and the moving wafer table WTB corresponding to a separate, moving side. The dashed lines in FIG. 4 indicate a non-contact or separate state.

A power source unit 90 and an operation (calculation) unit 92 are provided in the main control system 20. Further, a power supplying unit 48 for supplying power, connected to the power source unit 90 and attached to a slider 39 or 40, and a signal transmitting/receiving unit 49 on a fixed side, connected to the operation unit 92 and attached to the slider 39 or 40, are provided. The signal transmitting/receiving unit 49 on the fixed side transmits a control signal to a signal transmitting/receiving unit 47 and receives a detected signal of a strainmeter 45. The power source unit 90 performs high-frequency oscillation of a commercial power source of 200V or 100V with a power transistor switch and the like. The high-frequency oscillated voltage is transmitted to an electromagnetic induction coil constituting the power supplying unit 48. For the electromagnetic induction coil, an E type core or a pot core can be used. The signal transmitting/receiving unit 49 on the fixed side is configured with a photo coupler using infrared radiation or the like or a radio wave transceiver using weak radio waves, The photo coupler using infrared radiation or the like or the radio wave transceiver using weak radio waves can transmit/receive signals by superimposing them, by using two or more kinds of frequencies, or by providing frequency modulation.

Further, the power supplying unit 48 and the signal transmitting/receiving unit 49 on the fixed side may use a common coil, and the power receiving unit 46 and the signal transmitting/receiving unit 47 may use a common coil, to use the respective coils for both power supply and signal transmission/reception.

The wafer table WTB is provided with the power receiving unit 46, which is an electromagnetic induction coil, as a power source for input to the strainmeter 45 and as a power source to drive the signal transmitting/receiving unit 47. The primary side (power supplying unit 48) of the above-described transmitting device is high-frequency oscillated by a square-wave (or sine-wave) inverter, so that a square-wave (or sine-wave) voltage occurs on the secondary side (power receiving unit 46) in accordance with a turn ratio between the primary and secondary coils. The high-frequency voltage from the electromagnetic induction coil constituting the power receiving unit 46 is commutated by a commutation circuit in a control unit 94, and becomes a direct-current voltage via a power switch and the like, and a direct-current voltage of 1-5 V is input to an input terminal of a Wheatstone bridge circuit 96. The commutated direct-current voltage also becomes an input power source of the signal transmitting/receiving unit 47. A strainmeter 45 is connected to the Wheatstone bridge circuit 96, and an output (strain amount Sm) corresponding to the change in resistance is taken out. The output thus taken out is transmitted from the signal transmitting/receiving unit 47 to the signal transmitting/receiving unit 49 on the fixed side, and strain data (value computed from a plurality of strain amounts Sm) of the wafer table WTB is calculated by a correction unit in the operation unit 92. The correction unit may be provided at the wafer table WTB, and the calculated strain data may be transmitted from the signal transmitting/receiving unit 47 to the signal transmitting/receiving unit 49 on the fixed side. The control unit 94 applies an input voltage to the Wheatstone bridge circuit 96 in accordance with a sampling period. Sampling may be carried out every time exposure of one wafer W is completed, or sampling may be carried out any number of times during the exposure of one wafer W. Although a process of performing correction by measuring profile (contour) of a movable mirror (reflecting surface) for each lot (several tens of articles) was conventionally carried out, the process itself becomes unnecessary, and the strain amount of the wafer table WTB can be measured for each wafer or for each exposure (for each shot exposure) to grasp the geometry of the surface of the movable mirror (reflecting surface). Accordingly, the position accuracy of the wafer W can be improved than ever before.

Figure 5:
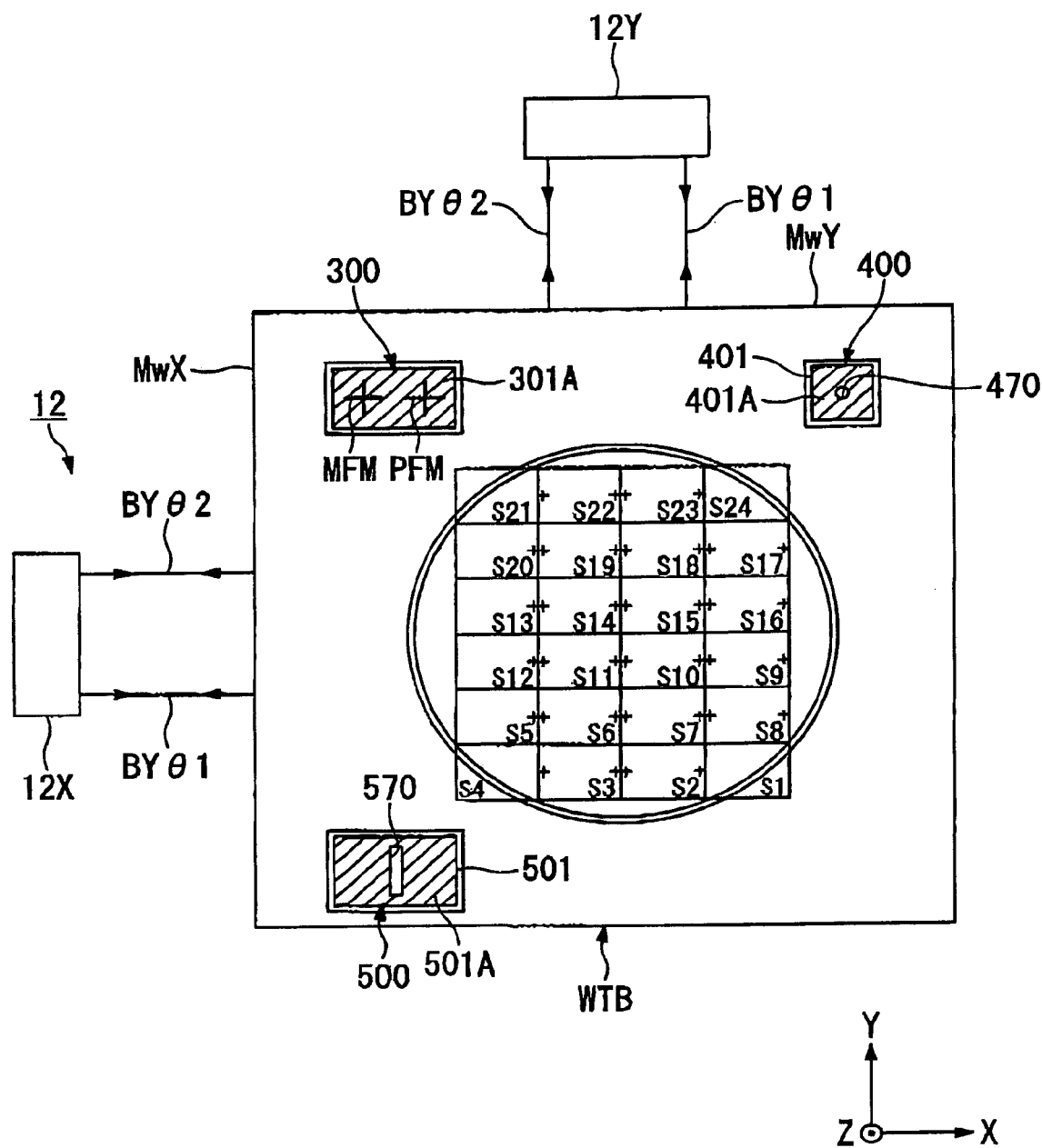
FIG. 5 is a plan view of the wafer table as seen from above.

FIG. 5 is a plan view, as seen from above, of the wafer table WTB that is movable while holding a wafer W. The actuators are not shown in the figure. Referring to FIG. 5, reflecting surfaces Mw (MwX, MwY) are arranged at two edge portions perpendicular to each other of the wafer table WTB of a rectangular shape as seen in two dimensions. It is noted that in FIG. 5 and the subsequent figures, the laser interferometer 12Y is positioned on the opposite side of the wafer table WTB from its position as shown in FIG. 2, for convenience of explanation.

A reference member 300 is arranged on the wafer table WTB at a prescribed position on an outer side of the wafer W. The reference member 300 has a reference mark PFM to be detected by an alignment system 22 and a reference mark MFM to be detected by a reticle alignment system 21, which are positioned in a prescribed positional relation. The reference member 300 has an approximately flat upper surface 301A, which is provided at an approximately same level (flush) as the surface of the wafer W held by the wafer table WTB and the upper surface of the wafer table WTB. The upper surface 301A of the reference member 300 can also serve as a reference plane of a focus detection system (for example, auto-focus sensors 23A, 23B).

The alignment system 22 also detects an alignment mark formed on the wafer W. As shown in FIG. 5, a plurality of shot areas S1-S24 are formed on the wafer W, and a plurality of alignment marks are provided on the wafer W corresponding to the plurality of shot areas S1-S24. Although the shot areas are shown to be adjacent to each other in FIG. 5, they are in effect separate from each other, and the alignment may are provided on the scribe lines corresponding to the separating regions.

A dose uniformity sensor 400 as a measuring sensor is arranged on the wafer table WTB in a prescribed position on an outer side of the wafer W. The dose uniformity sensor 400 has an upper wall 401 of a rectangular shape as seen in two dimensions. An upper surface 401A of the upper wall 401 is approximately flat, which is provided at an approximately same level (flush) as the surface of the wafer W held on the wafer table WTB and the upper surface of the wafer table WTB.

An aerial image sensor 500 is also provided on the wafer table WTB in a prescribed position on an outer side of the wafer W. The aerial image sensor 500 has an upper wall 501 of a rectangular shape as seen in two dimensions. An upper surface 501 A of the upper wall 501 is approximately flat, which is provided at all approximately same level (flush) as the surface of the wafer W held on the wafer table WTB and the upper surface of the wafer table WTB.

Although not shown, a dose sensor (illuminance sensor) is also provided on the wafer table WTB. An upper wall of the dose sensor has an upper surface provided at an approximately same level (flush) as the surface of the wafer W held on the wafer table WTB and the upper surface of the wafer table WTB.

On the −X side end and the +Y side end of the wafer table WTB of a rectangular shape as seen in two dimensions, there are respectively provided a reflecting surface MwX formed along the Y axis direction and approximately perpendicular to the X axis direction, and a reflecting surface MwY formed along the X axis direction and approximately perpendicular to the Y axis direction. A laser interferometer 12X constituting the laser interferometer system 12 is provided at a position facing the reflecting surface MwX. A laser interferometer 12Y constituting the laser interferometer system 12 is provided at a position facing the reflecting surface MwY. The reflecting surface MwX is perpendicularly irradiated with a beam BX from the laser interferometer 12X to detect the position (distance change) in the X axis direction, while the reflecting surface MwY is perpendicularly irradiated with a beam BY from the laser interferometer 12Y to detect the position (distance change) in the Y axis direction. The beam BX has an optical axis parallel to the X axis direction, while the beam BY has an optical axis parallel to the Y axis direction, which are orthogonal (crossing perpendicular) to each other on the optical axis AX of the projection optical system PL.

<Measuring Method of Profile of Reflecting Surface>

Hereinafter, an example of the measuring method of profile (contour, inclination) of the reflecting surfaces MwX, MwY will be described.

Figure 6:
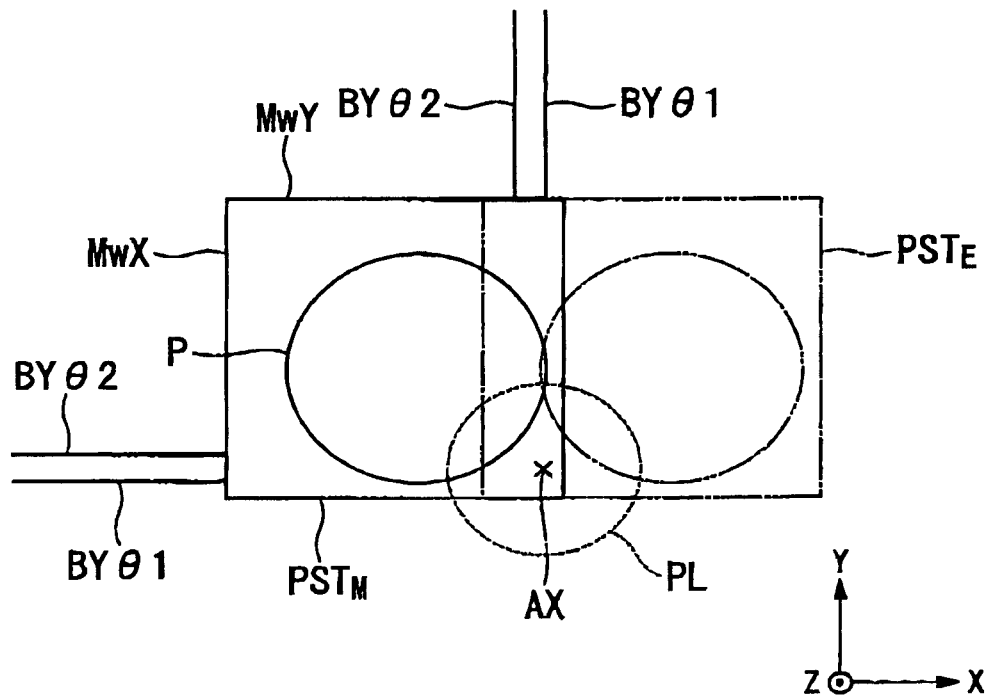
FIG. 6 shows a measuring method of profile (contour, inclination) of a reflecting surface.

Before exposure of a first wafer W, the wafer table WTB is at a prescribed temperature, and is not deformed due to thermal expansion and the like. In this state, the wafer table WTB is moved along the X axis direction from a start position PSTE toward an intermediate position PSTM by the main control system 20, as shown in FIG. 6. During the movement the main control system 20 acquires data for calculating the profile of the reflecting surface MwY. Specifically, the main control system 20 moves the wafer table WTB in the −X direction from the start position PSTE to the intermediate position PSTM, while monitoring the measurement values of the laser interferometers 12X and 12Y. The movement involves acceleration after initiation of movement, constant velocity movement, and deceleration immediately before termination of movement in this order. In this case, the table mostly moves at a slow, constant velocity, with a short acceleration region and a short deceleration region.

During the movement of the wafer table WTB as described above, the main control system 20 samples the measurement values of the laser interferometers 12Y and 12X in synchronization with the sampling timing of every predetermined number of measurement values of the laser interferometer 12X, and calculates the profile (contour or inclination data) for calculation of profile of the reflecting surface MwY in the following manner.

Hereinafter, a calculating method of the profile of the reflecting surface MwY will be described with reference to FIG. 8. Although the interferometer in effect measures the amounts of rotation of the reflecting surfaces MwX and MwY with respect to a fixed mirror (the above-described reference mirror) as described above, here it is assumed, for simplification of explanation, that the laser interferometer 12Y detects a local inclination (amount of rotation or amount of bending) of the reflecting surface MwY with respect to a virtually fixed reference line RY as the profile of the surface.

Figure 8:
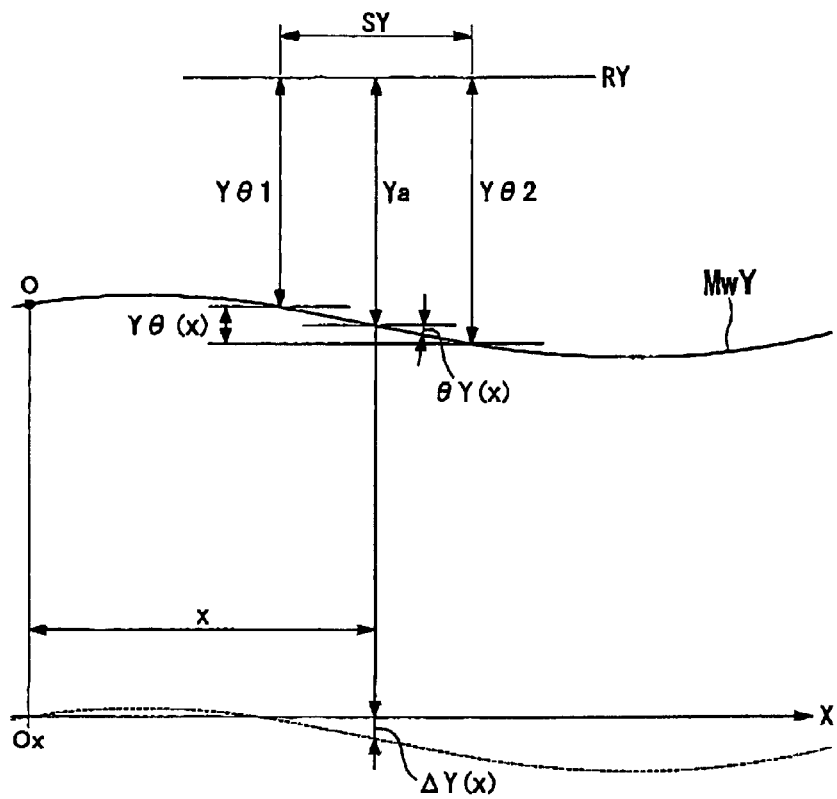
FIG. 8 shows calculation of profile of a reflecting surface.

Referring to FIG. 8, a distance between the reference line RY and the reflecting surface MwY is represented as Ya (average value measured with measurement values $Y\theta1$ and $Y\theta2$: Ya=$(Y\theta1+Y\theta2)/2$), and a local rotation amount (tilt angle, bending angle) of the reflecting surface MwY at the relevant position is represented as $\theta Y(x)$. The laser interferometer 12Y measures the measurement values $Y\theta1$ and $Y\theta2$ from the reference line RY to the reflecting surface MwY at two points on the reference line RY spaced apart from each other by SY in the X axis direction, and measures the measurement value $Y\theta(x)$ of the two distances. That is, it measures the measurement value $Y\theta(x)$ indicated by the following expression (1).

$$Y\theta(x)=Y\theta2-Y\theta1 \quad (1)$$

Here, it is assumed that the main control system 20 starts measurement when the reflecting surface MwY is at a reference point Ox in the X axis direction, that is, at the time point when the beam BY of the laser interferometer 12Y is incident on a point O fixed on the reflecting surface MwY. This time point corresponds to the time point when acceleration of the wafer table WTB is finished. It is assumed that, at this time, the main control system 20 resets the measurement values of the laser interferometers 12X and 12Y both to zero. The lower half part of FIG. 8 visually indicates the reset state, In this case, the local rotation amount (tilt angle) $\theta Y(x)$ of the reflecting surface MwY is very small, which is at most about 1-2 seconds, and the distance SY is from 10 mm to several tens mm, so that the angle $\theta Y(x)$ can be approximated with the following expression (2).

$$\theta Y(x)=Y\theta(x)/SY \quad (2)$$

Meanwhile, a depth of contour $\Delta Y(x)$ of the reflecting surface MwY with respect to a Y coordinate value of the reflecting surface MwY at the reference point Ox ($\Delta Y(x)=0$) can be obtained from the following expression (3), with the reference point Ox being set to x=0.

$$\Delta Y(x) = \int_0^x \theta Y(x)\,dx \quad (3)$$

In effect, however, the wafer table WTB may suffer yawing and the like during movement, and thus, $\Delta Y(x)$ includes an error due to an amount of yawing in addition to the irregularities due to inclination of the reflecting surface MwY. This means that the error due to the amount of yawing needs to be subtracted from the value obtained from the above expression (3).

In this case, as the wafer table WTB moves only in one dimension in the X axis direction, two beams $BX\theta1$ and $BX\theta2$ of the laser interferometer 12X are each continuously directed to substantially the same point on the reflecting surface MwX. Since the measurement value of the laser interferometer 12X is reset at the reference point Ox as described above, the value of the laser interferometer 12X at the position x becomes the yawing amount $X\theta(x)$ of the wafer table WTB with respect to the reference point Ox.

Thus, the profile $DY1(x)$ of the reflecting surface MwY is obtained by performing correction and operation as in the following expression (4), by using the measurement value $X\theta(x)$ of the laser interferometer 12X corresponding to the measurement value $\theta Y(x)$ of the laser interferometer 12Y used for calculating the depth of contour $\Delta Y(x)$ of the reflecting surface MwY.

$$DY1(x) = \int_0^x \theta Y(x)\,dx - \int_0^x X\theta(x)\,dx \quad (4)$$

In the main control system 20, the operation of the above expression (4) is carried out every time data $\theta Y(x)$ and $X\theta(x)$ are sampled, and the profile $DY1(x)$ of the reflecting surface MwY corresponding to each sampling point is stored in a memory MRY.

At this time, it is assumed that final sampling data as a subject of operation of the above expression (4) is data corresponding to x=L, and it is assumed that the time point of x=L corresponds to the point when deceleration of the wafer table WTB is started. It is noted that, to be strict, an influence of the pitching amount should be taken into account as well.

As described above, to measure the profile of the reflecting surface MwY provided approximately along the X axis direction, the wafer table WTB is moved to a plurality of positions in the X axis direction and a plurality of pieces of information corresponding to the plurality of positions are measured to enable measurement of the profile of the reflecting surface MwY. Further, as described above, during the movement of the wafer table WTB in the X axis direction, the reflecting surface MwY is irradiated with a plurality of beams approximately parallel to the Y axis direction by the laser interferometer 12Y for measurement of position information of the wafer table WTB, and the reflected light from the reflecting surface MwY is received, whereby the main control system 20 can measure the profile of the reflecting surface MwY efficiently based on the result of reception of light by the receiver.

Figure 7:
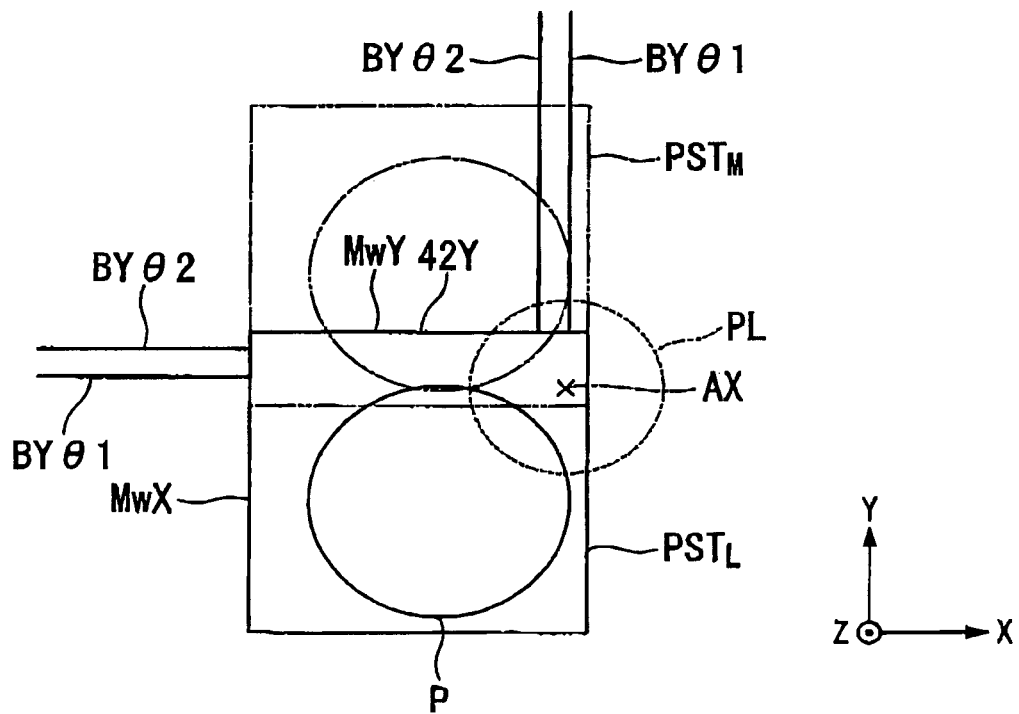
FIG. 7 shows a measuring method of profile (contour, inclination) of another reflecting surface.

Next, the main control system 20 moves the wafer table WTB in the -Y direction from the intermediate position PSTM toward a last position PSTL, while monitoring the measurement values of the laser interferometers 12X and 12Y, as shown in FIG. 7. In this case again, acceleration after initiation of movement, constant velocity movement, and deceleration immediately before temination of movement, are carried out in this order. In this case as well, the table moves mostly at a cost velocity, with a short acceleration range and a short deceleration range. The profile of the reflecting surface MwX can be measured in a similar manner as in the case of the profile of the reflecting surface MwY described above.

<Calculating Method of Strain Data of Wafer Table WTB>

Now that the profile of the reflecting surface has been obtained, exposure of the wafer W is initiated. An amount of deformation of the wafer table WTB is calculated by a strainmeter every time one wafer W is exposed. A way of calculating the deformation amount, i.e., strain data, will now be described with reference to FIG. 9.

Figure 9:
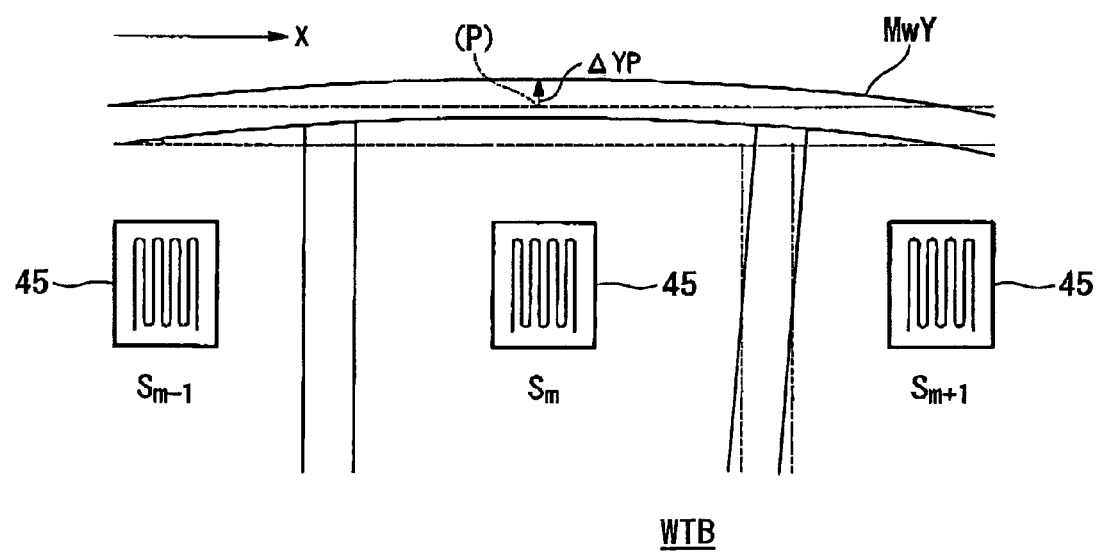
FIG. 9 shows a calculating method of strain data.

Referring to FIG. 9, it is assumed that strain data $\Delta Yp$ in the Y direction at a point p in the X direction is to be obtained. The broken lines indicate a partial wall surface and ribs of the wafer table WTB that has suffered no deformation, and the solid lines indicate the partial wall surface and the ribs of the wafer table WTB after deformation due to thermal expansion. The reflecting surface MwY is formed at this wall surface, and is irradiated with a beam from the laser interferometer 12Y. While a plurality of (n) strainmeters 45 are attached to the back surface of the wafer table WTB, three strainmeters 45 are shown in FIG. 9, which detect the deformation amount in the Y direction. Each of the strainmeters 45, attached to prescribed positions, has relation to the strain data in the Y direction at the point p in the X direction. For example, even an output signal of the strainmeter 45 that measures the deformation amount in the Z direction has an influence on the strain data $\Delta Yp$. When the influence of each strainmeter 45 on the point p is represented as a coefficient Kp and the output of each strainmeter 45 is represented as a strain amount Sm (m is an integer of at least 1 and not more than n), the strain data $\Delta Yp$ can be represented by the following expression (5).

$$\Delta Yp = \sum_{m=1}^{n} Kpm \cdot Sm \quad (5)$$

The coefficient Kp is obtained for each point in accordance with the attached position of the strainmeter 45, direction of measurement of the strainmeter 45 (X, Y or Z direction) and the like, by a finite analytic method or by analysis through experiments.

Since the profile DY1(x) of the reflecting surface MwY has been obtained by the expression (4), the net profile MDY1(x) at the current point can be obtained by the following expression (6) by subtracting the strain data $\Delta Yp$.

$$MDY1(x) = DY1(x) - \Delta Yp \quad (6)$$

<Flow of Exposure Using Strain Data>

Figure 10:
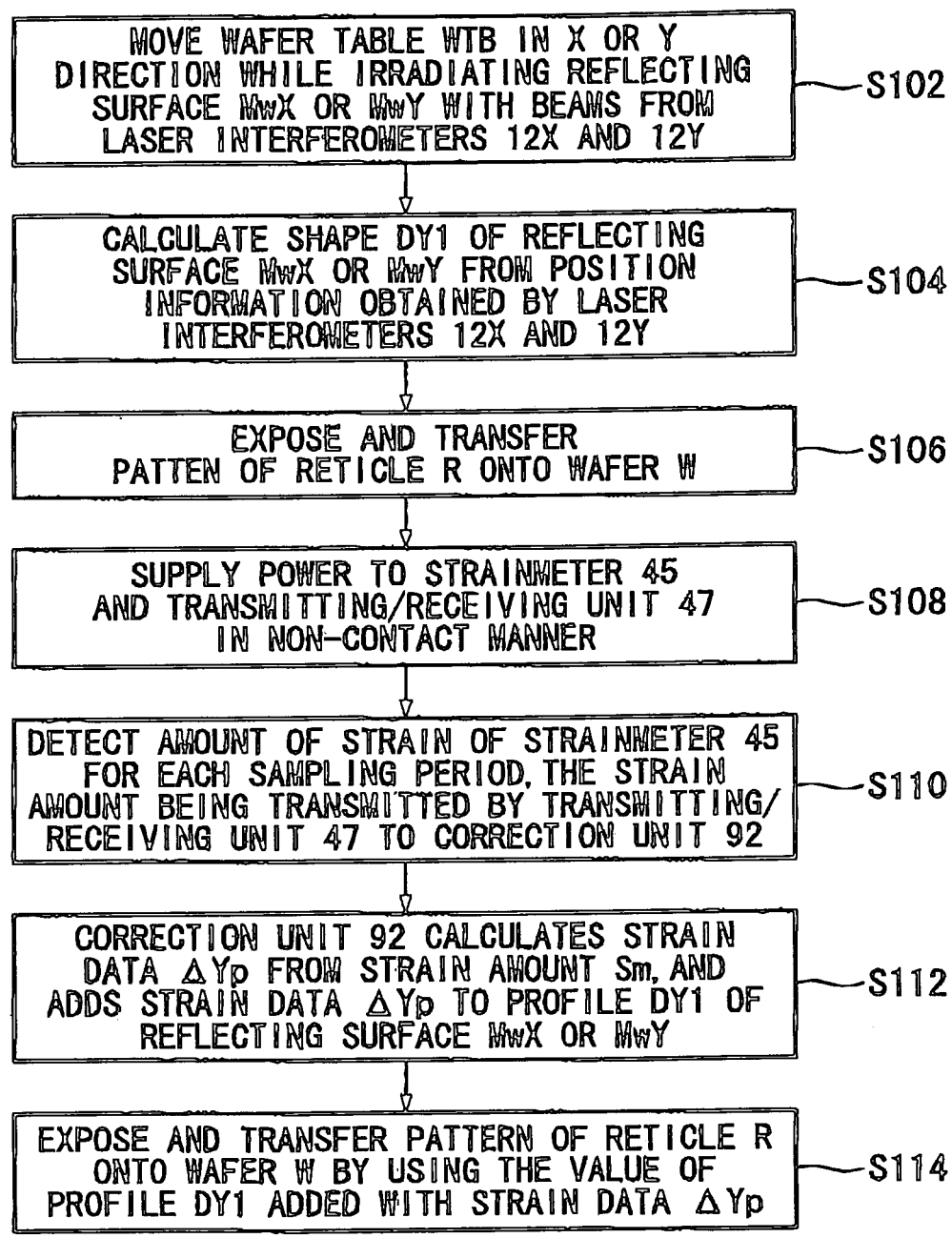
FIG. 10 is a flowchart of calculation of profile of a reflecting surface and strain data.

Hereinafter, an example of a flow of the exposure using the strain data will be explained with reference to FIG. 10.

In step 102, the wafer table WTB is moved in the X or Y direction, while irradiating the reflecting surface MwX or MwY with the beams from the laser interferometers 12X and 12Y, so as to examine the state of the wafer table WTB before thermal deformation.

In step 104, the profile of the reflecting surface MwX or MwY is calculated from the position information obtained by the laser interferometers 12X and 12Y.

In step 106, the first wafer in the lot is rested on the wafer table WTB and moved to the place beneath the projection optical system PL to expose and transfer the pattern of the reticle R onto the wafer W. In step 108, power is supplied to the strainmeter 45 and the transmitting/receiving unit 47 in a non-contact manner via the power supplying unit 48 and the power receiving unit 46. The power is supplied constantly during the exposure.

In step 110, the strain data (the strain amount) of the strainmeter is detected for each sampling period (for example, for every several shots for transfer, for each prescribed time, or for each wafer). The detected strain data (the strain amount) is transmitted from the transmitting/receiving unit to the correction unit.

In step 112, the correction unit in the operation unit 92 calculates the strain data from the transmitted strain data (the strain amount), and adds this strain data to the profile of the reflecting surface MwX or MwY. As described in conjunction with FIG. 4, the correction unit may be provided at the wafer table WTB and the calculated strain data may be transmitted from the signal transmitting/receiving unit 47 to the signal transmitting/receiving unit 49 on the fixed side.

In step 114, the pattern of the reticle R is exposed and transferred onto the wafer W, by using the value of the profile of the reflecting surface MwX or MwY added with the strain data.

The present invention is not limited to the above-described embodiment, but it is of course possible to take a variety of configurations within a scope that does not depart from the point of the invention. While the present invention has been explained with reference to the wafer stage, the present invention is naturally applicable to the reticle stage. Further, the strainmeter 45 may be attached to the base 31 instead of the wafer table WTB, because the position of the laser interferometer system 12 will change as the base 31 is deformed.

Further, it may be configured such that an amount regarding deformation in the Z direction of the movable table or the base or both are detected and the detected result is used to correct a measurement result of the position information (for example, focus position) of the movable table (wafer surface). For example, a configuration where the movable table is provided with a movable mirror for measurement of a position of the movable table in the Z direction with interferometers may be adapted, in which case an influence due to the deformation of the movable mirror for the Z direction can be restricted in a manner similar to the cases of the interferometers used for position measurement in the X direction and the Y direction described above.

Furthermore, while the strainmeter has been used as the deformation amount detection unit, not limited thereto, any other means may be used as long as it can measure an amount regarding deformation.

The movable mirror Mr for the reticle stage is not limited to the plane (flat) mirror. It may be constituted to include a corner cube (retroreflector) alternately using the plane mirror, and instead of fixing the movable mirror to the reticle stage, providing a reflection surface by polishing the side wall (end surface) of the reticle stage as a mirror surface. Further, the reticle stage may be constituted to be moved by a coarse stage and a fine stage as Japanese Patent Laid-opened No. H08-130179 (corresponding U.S. Pat. No. 6,721,034).

The structure, which measures information regarding position of the wafer stage in the Z direction, and rotation angle around the X and Y axes by the laser interferometer 12 for the wafer stage, is described in the Japanese Patent Laid-open No. 2001-510577 (corresponding PCT International Publication No. WO 1999/28790). Further, instead of fixing the movable mirror to the wafer stage, providing a reflection surface by polishing the side wall (end surface) of the wafer stage as a mirror surface. In the case where the laser interferometer 12 can measure position of the wafer W in the Z direction, and rotation angle around the X and Y axes, the focus sensor 23A, 23B provided so that it measures position of the wafer W in the Z direction during the exposure can be deleted. Then control of the wafer W regarding position in the Z direction, and rotation angle around the X and Y axes can be performed by using the result of the laser interferometer 12 during the exposure.

The present invention is applicable to an exposure apparatus and an exposure method that did not use the projection optical system PL. In the case that the projection optical system PL is not used, the exposure light irradiate the wafer via the reticle and the optical member such as the lens.

Further, the present invention is also applicable to an immersion type exposure apparatus for example. In the immersion type exposure apparatus, a wafer or a wafer table holding the wafer may suffer deformation due to an influence of a weight of a liquid. Even in such a case, according to the present invention, the influence of the liquid can be restricted by measuring the amount regarding deformation of the movable table.

An immersion exposure apparatus is disclosed in the PCT International Publication No. WO 99/49504. Further, the present invention is also applicable to an immersion exposure apparatus that performs exposure in the state where the entire surface of the substrate to be exposed is immersed in a liquid, as disclosed in Japanese Patent Laid-Open No. H06-124973, Japanese Patent Laid-Open No. H10-303114, U.S. Pat. No. 5,825,043, and others.

For the substrate of each embodiment described above, not only a semiconductor wafer for manufacturing a semiconductor device, but also a glass substrate for a display device, a ceramic wafer for a thin-film magnetic head, or a mask or a reticle original plate (quart, silicon wafer) for use in an exposure apparatus and the like may be used.

With regard to the exposure apparatus, the present invention is applicable, not only to the exposure apparatus which employs a step-and-repeat method (stepper) wherein a pattern of the reticle (mask) R is exposed at one shot with the reticle R and the wafer W in a stationary state, and the wafer W is successively moved in a stepwise manner, but also to the scanning type exposure apparatus which employs a step-and-scan method (scanning stepper) wherein the pattern of the reticle R is scanned and exposed while synchronously moving the reticle R and the wafer W. Still further, the present invention is also applicable to an exposure apparatus which employs a step-and-stitch method wherein at least two patterns partially overlaid are transferred onto the wafer W, and the wafer W is moved successively.

Furthermore, the present invention is also applicable to a twin-stage type exposure apparatus where a plurality of wafer stages are provided. The structure and the exposure operation of the twin-stage type exposure apparatus are disclosed, e.g., in Japanese Patent Laid-Open No. H10-163099 and Japanese Patent Laid-Open No. H10-214783 (corresponding U.S. Pat. Nos. 6,341,007, 6,400,441, 6,549,269, and 6,590,634), Published Japanese Translation No. 2000-505958 of the PCT International Application (corresponding U.S. Pat. Nos. 5,969,441), or 6,208,407. Further, the present invention may be applied to a stage device as disclosed in PCT International Publication No. WO 2005/122242.

Still further, the present invention may be applied to an exposure apparatus provided with a substrate stage for holding a substrate and a measurement stage having a reference member formed with a reference mark and various photoelectric sensors mounted thereon, as disclosed in Japanese Patent Laid-Open No. H11-135400 (corresponding PCT International Publication No. WO 1999-23692) and Japanese Patent Laid-Open No. 2000-164504 (corresponding U.S. Pat. No. 6,897,963).

The type of the exposure apparatus is not limited to the exposure apparatus for manufacturing a semiconductor element that exposes a semiconductor element pattern onto a substrate. The present invention is applicable widely to an exposure apparatus for manufacturing a liquid crystal display element or for manufacturing a display such as a plasma display and the like, and an exposure apparatus for manufacturing a thin-film magnetic head, an image forming element (CCD), or a reticle or a mask and the like. The present invention is also applicable to a projection exposure apparatus that uses as an exposure light source the extreme ultraviolet radiation (EUV radiation) of wavelengths of about several nm to about 100 nm.

In the embodiment described above, an optically transparent type mask having a prescribed light-blocking pattern (or phase pattern, light-reducing pattern) formed thereon has been used on an optically transparent substrate. In place of this mask, an electronic mask that forms a transparent pattern, a reflecting pattern, or a light-emitting pattern based on electronic data of a pattern to be exposed, as disclosed, e.g., in U.S. Pat. No. 6,778,257, may be used. The electronic mask is so-called as a mask for changeable forming pattern, and for example, includes a DMD (Digital Micro-mirror Device) as one kind of a non-emissive type image display device (a spatial light modulator).

In addition, the present invention is also applicable to an exposure apparatus that exposes a pattern of a line-and-space onto the substrate by forming the interference fringes. Such an exposure method and an exposure apparatus are disclosed in, for example, PCT International Publication No. WO 01/35168.

In addition, the present invention is also applicable to an exposure apparatus that performs a double exposure method that exposes the one shot region of the substrate by integrating two pattern of the mask on the substrate with the optical system, at the substantially same time with one scanning exposure. Such an exposure apparatus and exposure method are disclosed in, for example, the Japanese patent Laid-open No.2004-519850 (corresponding U.S. Pat. No. 6,611,316).

As far as is permitted, the disclosures in all of the Patent Publications cited in the above respective embodiments and modified examples, are incorporated herein by reference.

The exposure apparatus of the present embodiment is manufactured by assembling various sub-systems including the constituent elements, to maintain prescribed mechanical accuracy, electrical accuracy and optical accuracy. To maintain these accuracies, adjustment for achieving the optical accuracy is carried out for various optical systems, adjustment for achieving the mechanical accuracy is carried out for various mechanical systems, and adjustent for achieving the electrical accuracy is carried out for various electrical systems, before and after the assembly. The assembling step of various sub-systems to the exposure apparatus includes mechanical connection, wiring connection of the electric circuits, and piping connection of the pressure circuits among the sub-systems. It is needless to say that there are assembling steps of the respective sub-systems before the assembling step of the sub-systems to the exposure apparatus. Following the assembling step of the sub-systems to the exposure apparatus, overall adjustment is carried out to guarantee various accuracies as the exposure apparatus as a whole. It is desirable that the exposure apparatus is manufactured in a clean room in which the temperature, cleanliness and others are controlled.

Figure 11:
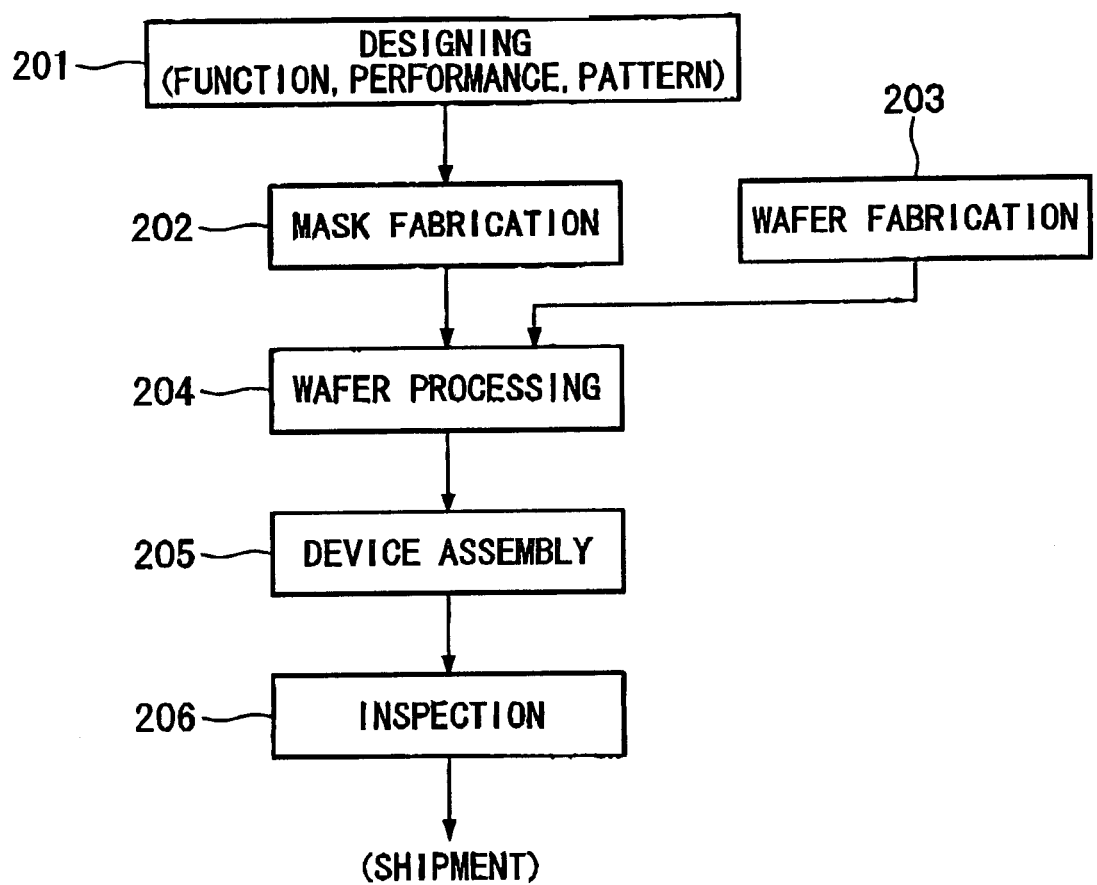
FIG. 11 is a flowchart showing an example of a manufacturing process of a semiconductor device.

A micro device such as a semiconductor device and the like is manufactured, as shown in FIG. 11, through the step 201 of performing function and performance designing of the micro device, the step 202 of fabricating a mask (reticle) based on the designing step, the step 203 of fabricating a substrate as a base member of the device, the exposure processing step 204 of exposing a mask pattern onto the substrate by the exposure apparatus of the embodiment described above, the device assembling step 205 (including dicing process, bonding process, and packaging process), the inspection step 206, and the like.

The stage device is possible to constantly monitor deformation of a surface plate, or a table portion and a movable mirror themselves. This eliminates the need of measuring profile of a surface (contour) of the movable mirror for each lot (several tens of articles). Accordingly, it is unnecessary to interrupt exposure, which leads to improvement of productivity. Further, although considerable deformation of the table portion or the like during processing of a lot may cause a stage to be moved with poor position accuracy thereafter, such a problem will not occur as the strain data is measured constantly.

What is claimed is:

1. An exposure apparatus that transfers a predetermined pattern onto a substrate, comprising:
    an optical member through which exposure light is transmitted;
    a base that has a guide surface;
    a substrate table that supports the substrate and that moves relative to the optical member along the guide surface while being supported above the guide surface in a non-contact manner;
    a position information obtaining device that obtains position information of the substrate table while the substrate table is moving;
    a shape information obtaining device that is provided at the substrate table and that obtains shape information of the substrate table;
    a transmitting device that transmits electricity to the shape information obtaining device in a non-contact manner and that receives the shape information of the substrate table from the shape information obtaining device in a non-contact manner; and
    a control device that communicates with the position information obtaining device and the shape information obtaining device and that controls a movement of the substrate table based on the position information of the substrate table from the position information obtaining device and the shape information of the substrate table from the shape information obtaining device.

2. The exposure apparatus according to claim 1, wherein the substrate is irradiated with the exposure light via a liquid in a space between the optical member and the substrate.

3. The exposure apparatus according to claim 2, wherein the shape information of the substrate table comprises a deformation of the substrate table due to a weight of the liquid.

4. The exposure apparatus according to claim 1, wherein
    the substrate table has a holding surface on which the substrate is held, the shape information obtaining device being provided at a back surface, which is reverse to the holding surface.

5. A device manufacturing method using a lithographic process in which a predetermined pattern is formed on a reticle and is transferred onto a substrate, the method comprising:
    supporting the substrate with a substrate table;
    supporting the substrate table above a guide surface in a non-contact manner and moving the substrate table along the guide surface;
    obtaining position information of the substrate table while the substrate table moves;
    obtaining shape information of the substrate table while the substrate table moves, by a detection portion that is provided at the substrate table;
    supplying the detection portion with electricity in a non-contact manner;
    transmitting the shape information of the substrate table in a non-contact manner from the detection portion to the control device;
    controlling a movement of the substrate table by the control device based on the position information and the shape information;
    moving the reticle in synchronization with the movement of the substrate table; and
    irradiating the substrate with exposure light.

6. The device manufacturing method according to claim 5, further comprising:
    supplying a liquid in a space between an optical member and the substrate that is supported by the substrate table, exposure light from the optical member being irradiated onto the substrate through the liquid.

7. The device manufacturing method according to claim 6, wherein the shape information of the substrate table comprises a deformation of the substrate table due to a weight of the liquid.

8. The device manufacturing method according to claim 5, wherein
    the substrate table has a holding surface on which the substrate is held, the detection portion being provided at a back surface, which is reverse to the holding surface.

9. An exposure apparatus that irradiates a substrate with an energy beam via a projection optical system to expose the substrate, the apparatus comprising:
    a substrate table that moves relative to the projection optical system while holding the substrate;
    a position information detection device that has a first portion and a second portion and that obtains position information of the substrate table by cooperation between the first portion and the second portion, the first portion being provided at the substrate table, the second portion being capable of moving relative to the first portion;
    a profile detection device that is provided at the substrate table or at the first portion and that obtains profile information of the substrate table or the first portion;
    a transmitting device that supplies an electric power to the profile detection device in a non-contact manner while the substrate table moves, and
    a control device that communicates with the position information detection device and the profile detection device and that controls a movement of the substrate table based on the position information of the substrate table from the position information detection device and the profile information of the substrate table from the profile detection device.

10. The exposure apparatus according to claim 9, wherein
    the profile detection device transmits, in a non-contact manner, the obtained profile information, and
    while the substrate table moves, the transmitting device receives, in a non-contact manner, the profile information obtained by the profile detection device.

11. The exposure apparatus according to claim 10, wherein the second portion has a third portion and a fourth portion that supports the third portion, an optical path of a measurement beam, which is for obtaining the position information, being formed between the first portion and the third portion.

12. The exposure apparatus according to claim 11, wherein the fourth portion has a guide surface above which the substrate table is movably provided.

13. The exposure apparatus according to claim 11, wherein the profile information comprises surface profile information of a surface formed on the first portion, the surface of the first portion being irradiated with the measurement beam.

14. The exposure apparatus according to claim 9, further comprising:
a drive device that is in communication with the position information detection device and the transmitting device and that drives the substrate table based on the position information of the substrate table obtained by the position information detection device and on the profile information obtained by the profile detection device.

15. The exposure apparatus according to claim 9, further comprising:
a second substrate table that is capable of moving independently from the substrate table while a substrate is mounted thereon.

16. The exposure apparatus according to claim 9, wherein
a liquid is supplied to a space between the substrate and the projection optical system, and
the substrate is exposed with the energy beam via the projection optical system and the liquid.

17. A device fabricating method that comprises a lithographic process, wherein, in the lithographic process, a device pattern is transferred onto a substrate with the exposure apparatus according to claim 9.

18. A method of exposing a substrate with an energy beam via a projection optical system, the method comprising:
moving a substrate table relative to the projection optical system while the substrate is mounted on the substrate table;
obtaining a position information of the substrate table by use of a position information detection device in which a first portion and a second portion cooperate with each other, the first portion being provided at the substrate table, the second portion being capable of moving relative to the first portion;
while the substrate table moves, obtaining a profile information of the substrate table or the first portion by use of a profile detection device provided at the substrate table or the first portion;
supplying, in a non-contact manner, an electric power to the profile detection device;
controlling a movement of the substrate table by a control device based on the position information and the profile information;
moving a reticle in synchronization with the movement of the substrate table; and
irradiating the substrate with exposure light from the projection optical system.

19. The method according to claim 18, further comprising:
transmitting, in a non-contact manner, the profile information obtained by the profile detection device.

20. The method according to claim 19, wherein
the second portion has a third portion and a fourth portion that supports the third portion, an optical path of a measurement beam, which is for obtaining the position information, being formed between the first portion and the third portion.

21. The method according to claim 20, wherein
the fourth portion has a guide surface above which the substrate table is movably provided.

22. The method according to claim 20, wherein
the profile information comprises surface profile information of a surface formed on the first portion, the surface of the first portion being irradiated with the measurement beam.

23. The method according to claim 18, further comprising:
driving the substrate table based on the position information of the substrate table obtained by the position information detection device and on the profile information obtained by the profile detection device.

24. The method according to claim 18, further comprising:
moving a substrate by use of a second substrate table that is capable of moving independently from the substrate table.

25. The method according to claim 18, wherein
a liquid is supplied to a space between the substrate and the projection optical system, and
the substrate is exposed with the energy beam via the projection optical system and the liquid.

26. A device fabricating method that comprises a lithographic process, wherein, in the lithographic process, a device pattern is transferred onto a substrate with the method according to claim 18.

* * * * *

UNITED STATES PATENT AND TRADEMARK OFFICE
CERTIFICATE OF CORRECTION

| | | |
|---|---|---|
| PATENT NO. | : 8,681,314 B2 | Page 1 of 1 |
| APPLICATION NO. | : 11/584672 | |
| DATED | : March 25, 2014 | |
| INVENTOR(S) | : Ebihara et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 973 days.

Signed and Sealed this
Thirteenth Day of October, 2015

Michelle K. Lee
*Director of the United States Patent and Trademark Office*